United States Patent [19]

Gundry

[11] 4,066,914

[45] Jan. 3, 1978

[54] ELECTRICALLY VARIABLE IMPEDANCE CIRCUITS

[75] Inventor: Kenneth James Gundry, San Francisco, Calif.

[73] Assignee: Dolby Laboratories, Inc., San Francisco, Calif.

[21] Appl. No.: 735,957

[22] Filed: Oct. 27, 1976

[30] Foreign Application Priority Data

Oct. 31, 1975 United Kingdom ............... 45199/75

[51] Int. Cl.² .................................... H03K 5/08
[52] U.S. Cl. .................... 307/237; 307/264; 307/296 R; 323/79; 323/81
[58] Field of Search ............ 307/237, 296, 264; 330/30 D, 69; 323/8, 4, 22 T, 79, 81; 328/168, 171, 172, 173, 147

[56] References Cited

U.S. PATENT DOCUMENTS

| 3,719,833 | 3/1973 | Free ................................. 307/296 |
| 3,986,058 | 10/1976 | Hongu et al. .................. 307/296 |

*Primary Examiner*—John Zazworsky
*Attorney, Agent, or Firm*—Robert F. O'Connell

[57] ABSTRACT

In a known variable impedance circuit with the variable impedance established across junctions of transistors connected in two branches between a control current source, for variably forward-biasing the junctions, and an equalizing circuit for equalizing the currents in the branches, the balance of the circuit is upset when an amplifier connected to one branch draws input bias current therefrom. This problem is overcome by a transistor connected to the other branch to draw a matching current from the second branch. Transistors may be connected to both branches to increase the currents in the equalizing circuit and thereby improve the operation thereof when the control current is reduced to a low value for obtaining a high impedance.

5 Claims, 4 Drawing Figures

ELECTRICALLY VARIABLE IMPEDANCE CIRCUITS

The present invention relates to an electrically variable impedance circuit of the known type using forward biased semiconductor junctions to provide an electrically variable impedance at an input terminal of the circuit. By utilizing the junctions in matched sets connected in a balanced configuration, it is possible largely to prevent the electrical signal controlling the impedance from becoming mixed with signals applied to the variable impedance.

Examples of the known type of circuit are disclosed in U.S. Pat. No. 3,761,741. Under ideal conditions these known circuits are capable of performing satisfactorily, but two problems often prevent attainment of the ideal. The first problem arises when the input terminal is connected to an amplifier or other circuit which draws a non-negligible input bias current. This current creates an offset of the potential at the input terminal, the potential offset being determined by the product of the input current and the value of the controlled impedance. The offset potential varies as the controlled impedance is varied by a control current and, hence, isolation is lost between the control current and the signal imposed on the input terminal; the circuit is no longer properly balanced.

According to the present invention, there is provided an electrically variable impedance circuit comprising a source of a variable control current feeding first and second circuit branches connected to a circuit tending to equalize the currents in the two branches, each branch including at least one three-terminal semiconductor device connected in the branch by way of first and second terminals with further terminals of the devices interconnected via junctions of the two semiconductor devices and the point common to the two branches, the junctions being connected back to back and variably forward biased by the control current to provide a controlled impedance between a first one of the further terminals corresponding to the first branch and serving as a voltage reference and the second one of the further terminals corresponding to the second branch serving as an input terminal, and a first further semiconductor device connected to the first branch to pass a predetermined current establishing an offset between the current in that branch as determined by the current equalizing circuit and the current passing between the first and second terminals of the semiconductor device in the first branch.

In particular, the first further semiconductor device can match the input stage of the amplifier or other circuit connected to the input terminal so that the currents drawn by the input stage and by the first further device will always be at least approximately equal.

The second problem arises when the control current is reduced to a low value. The action of the current equalizing circuit then tends to fail. This second problem is overcome by providing a second further semiconductor device connected to the input terminal to draw bias current, the two further devices both acting to increase the current in the current equalizing circuit relative to the current through the semiconductor devices in the first and second branches.

If the circuit connected to the input terminal does not draw any appreciable current, the currents drawn by the first and second further devices should be equal. If the current drawn by the circuit conected to the input terminal is not negligible, the current drawn by the first further device should equal the sum of the currents drawn by the circuit in question and the second further device.

The invention will be described in more detail, by way of example, with reference to the accompanying drawings, in which.

Figure 1:
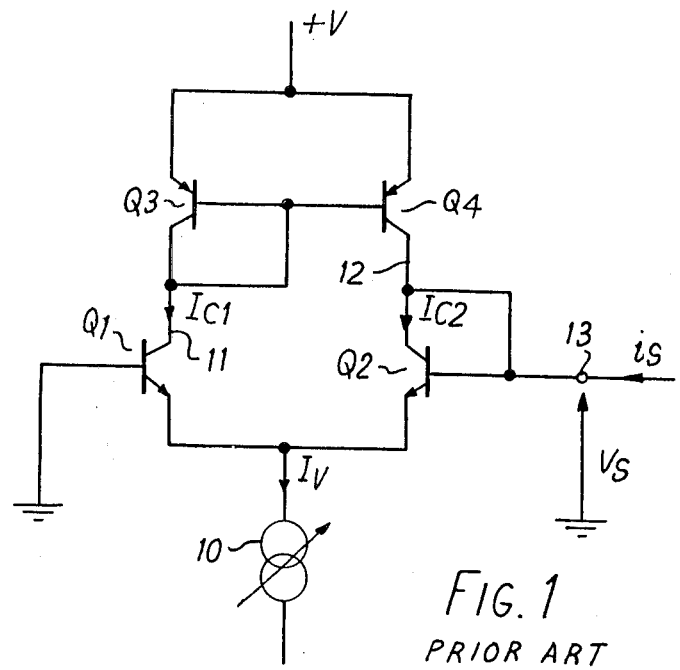
FIG. 1 is a diagram of a known circuit.

A basic known circuit as described in U.S. Pat. No. 3,761,741 is shown in FIG. 1. In the following brief description it will be assumed that the current gains of the transistors are high and that, therefore, collector currents are equal to emitter currents, while base currents can be neglected. It is further assumed that Q3 is identical with Q4 and Q1 with Q2.

The circuit comprises a controlled current source 10 whose current $I_v$ divides between two branches 11 and 12 including npn transistors Q1 and Q2 respectively.

Q3 and Q4 form a current equalizing circuit in which a current drawn through Q3 results in a substantially equal current flowing in Q4, because of the common base and emitter connections of Q3 and Q4. In practice, more complex current equalizing circuits are used, but the principle of operation remains unchanged. (Again see the aforementioned U.S. patent specification).

When a control current $I_v$ is drawn from the emitters of Q1 and Q2, a current $I_{c1}$ is set up in Q3, and hence by current equalizing action the current $I_{c2}$ in Q4 and Q2 is equal to $I_{c1}$. Since Q1 and Q2 have equal collector currents, their base-emitter potentials must also be the same. Thus, in the absence of an externally imposed signal, the input terminal 13 (base of Q2) remains at ground potential irrespective of the value of control current $I_v$, assuming that the reference potential on the base of Q1 is ground, as shown.

If a signal voltage $v_s$ is applied to the input terminal 13, a signal current $i_s$ will flow. The ratio of $v_s$ to $i_s$ is the impedance $R_v$ observed at the input terminal and determined by the forward biased base-emitter junctions of Q1 and Q2. This impedance is approximately inversely proportional to control current $I_v$.

It may be necessary, particularly in integrated circuits, to connect the input terminal 13 of such a controlled impedance directly to the input of an amplifier, and this amplifier may draw input bias current $I_B$ from the input terminal. The bias current will result in an offset potential of size $I_B R_v$ away from ground, and since $R_v$ varies with the control current $I_v$, this offset will vary also. Hence, isolation is lost between the control current $I_v$ and the signal imposed at the input terminal; the circuit is no longer balanced.

In integrated circuits incorporating the configuration of FIG. 1 or its more complex derivatives, the current equalizing circuit may employ devices (normally pnp transistors as shown), the matching of whose current gains is degraded at very low emitter currents. Therefore, at very low control currents, typically a microamp or less, the current equalizing action fails and the input terminal no longer remains at ground potential. Again isolation is lost between the control current and the signal applied to the input terminal.

Figure 2:
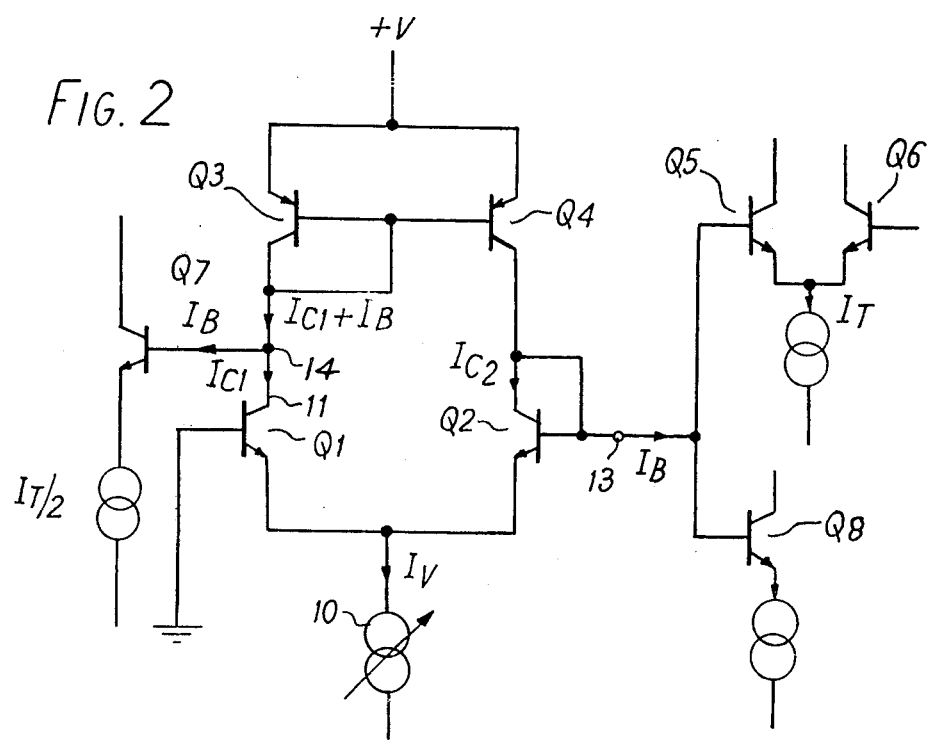
FIGS. 2 to 4 are diagrams of circuits embodying the invention.

When the imbalance is caused by current $I_B$ being drawn at the input terminal, whether as an amplifier input current or otherwise, the asymmetry can be eliminated in the embodiment of the invention shown in FIG. 2 by drawing an equal current out of point 14 in the branch 11. As above, the control current $I_v$ gives rise to Q1 collector current $I_{c1}$, but now the current in Q3 is $I_{c1} + I_B$. This is mirrored in Q4, so that $$i_{c2} = (I_{c1} + I_B) - I_B = I_{c1}$$

As before, the currents in Q1 and Q2 are equal, and the potential of the input terminal 13 remains at ground.

Figure 3:
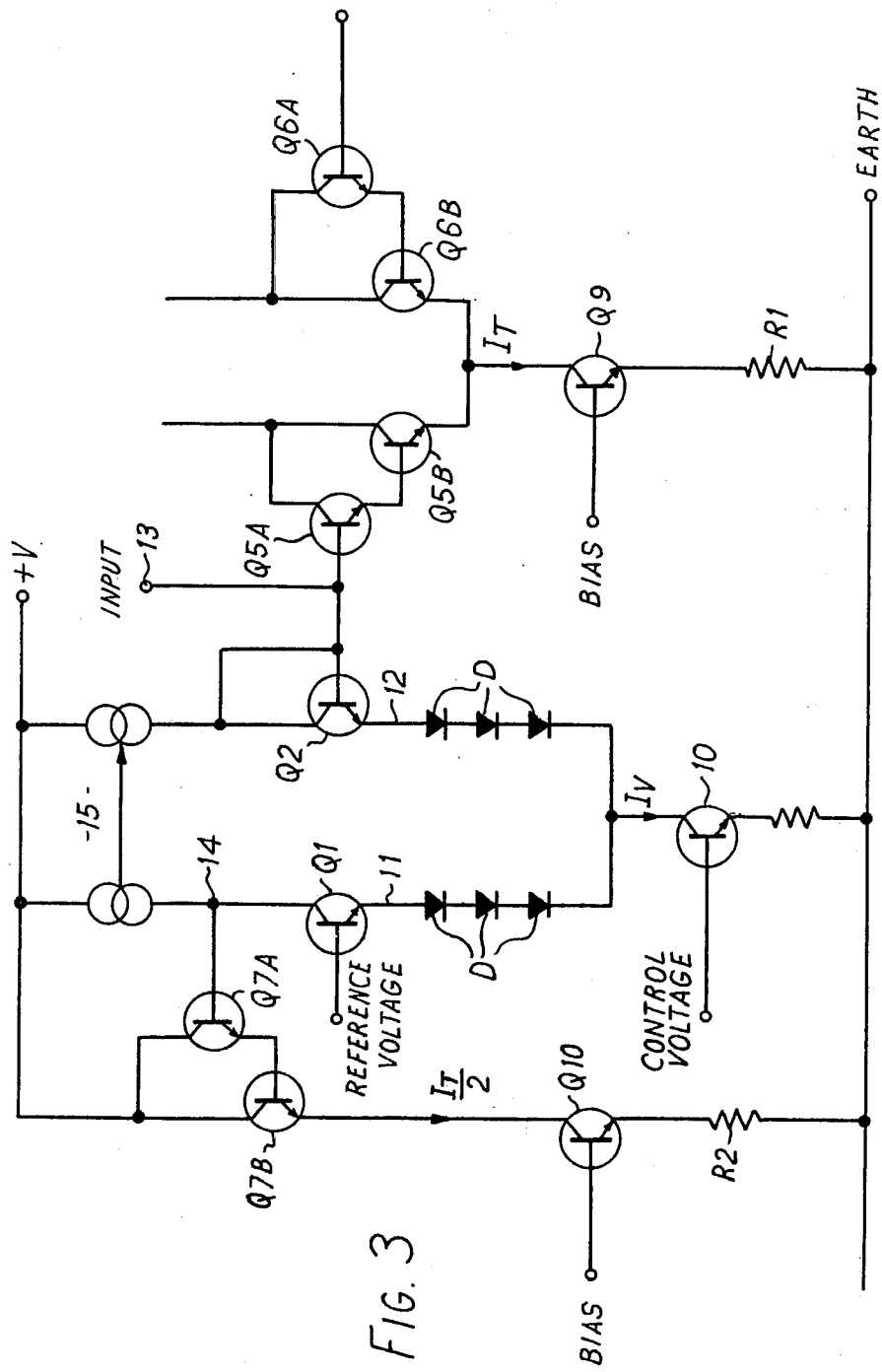

Typically, the current $I_B$ causing the original offset is the input base current of an amplifier with an input stage of the form shown in FIG. 2. The long-tailed pair configuration may use Darlington-connected transistor pairs in the Q5 and Q6 positions to reduce the magnitude of the base current and increase the input resistance (as shown in FIG. 3).

The correcting current sink to be connected to point 14 may then consist of another substantially identical amplifier employing transistors matching their counterparts in the first amplifier, and, therefore, having an equal input current. However, such complexity is usually unnecessary, and the correction circuit may instead resemble half of the input stage of the amplifier, as shown in FIG. 2, Q7 should match Q5 and Q6 of FIG. 2 and carry a current $I_T/2$ equal to that of Q5, i.e. half the total current $I_T$ carried by Q5 and Q6.

Clearly if the unbalancing current is of opposite polarity, for example through the use of pnp transistors in the amplifier input stage, the same method of restoring symmetry may be employed, with reversed polarity of compensation current.

If asymmetry occurs at low values of control current $I_v$, through failure of the current equalizing circuit Q3, Q4, it is possible to improve balance by increasing the minimum currents through the transistors Q3 and Q4 by drawing equal, normally but not necessarily fixed currents $I_B$ out of points 13 and 14, by connecting Q8 to point 13. Since the value of variable impedance $R_v$ is dependent on the currents in Q1 and Q2, and not on the currents in the current equalizing circuit, the extra current sinks do not affect $R_v$. Since the minimum currents in the equalizing circuit are now equal to or greater than $I_B$, the current equalizing circuit never works at such low currents that its operation fails.

Figure 4:
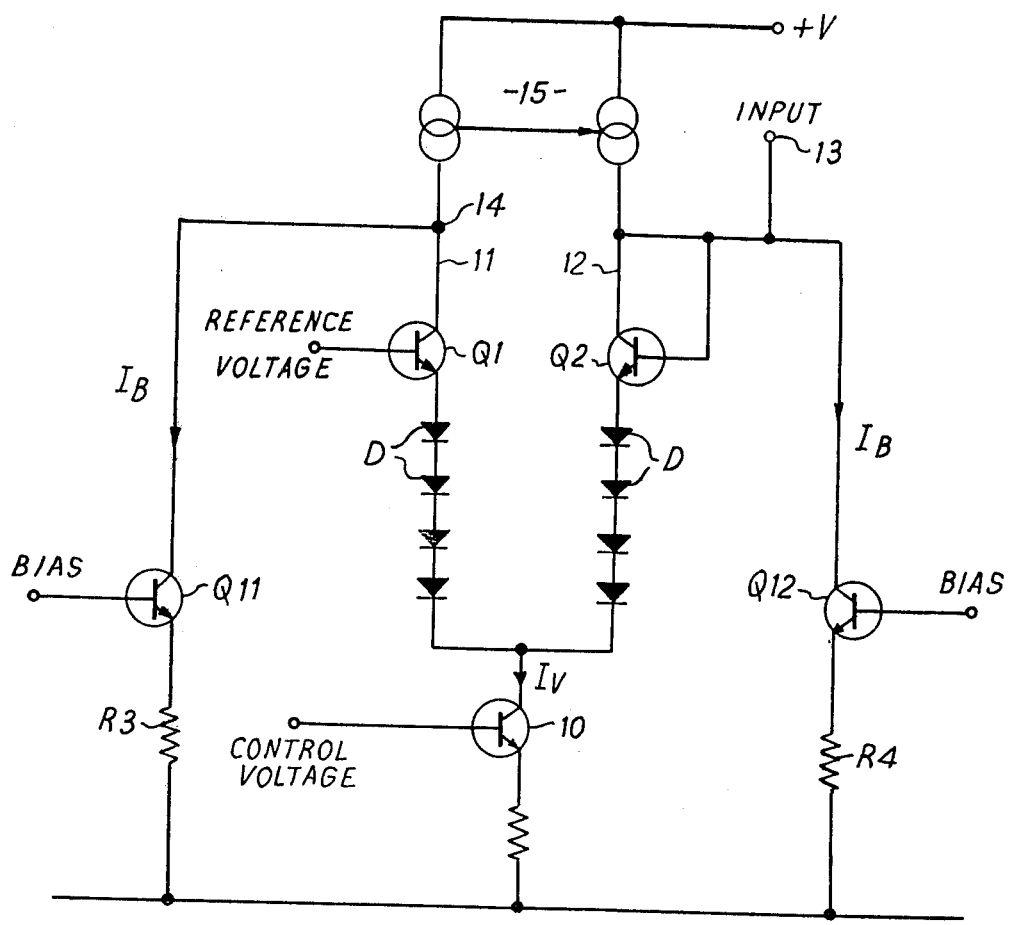

It is to be understood that if there is no problem arising from low currents in Q3 and Q4, it is not necessary to include Q8. This alternative is illustrated in FIG. 3. If Q8 is employed, the current $I_B$ drawn by Q7 should equal the total current drawn by Q8 and whatever circuit, such as Q5, is connected to the terminal 13. If the circuit connected to the terminal 13 in fact draws no current, then Q7 and Q8 draw equal currents $I_B$. This alternative is illustrated in FIG. 4.

In the circuit shown in FIG. 3, the amplifier connected to the input terminal 13 and drawing the input bias current $I_B$ is shown as a long-tailed pair with combined emitter current $i_T$ determined by a transistor Q9 and its emitter resistor R1. The two halves of the long-tailed pair are formed by Darlington-connected transistor pairs Q5A, Q5B and Q6A, Q6B. The compensating current $I_B$ drawn from point 14 is the base bias current drawn by another Darlington pair Q7A, Q7B matching Q5A, Q5B and with emitter current $I_T/2$ determined by Q10 and its emitter resistor R2.

In order to provide a higher value of the controlled impedance, each branch 11 and 12 includes more junctions in series with the base-emitter junctions of Q1 and Q2, the additional junctions being represented as diodes D although in practice diode-connected transistors are employed, as shown in the aforementioned U.S. specification. Because of the increased number of junctions (four per branch in FIG. 3 and five per branch in FIG. 4), it is no longer appropriate to make the reference voltage on the base of Q1 ground potential. It may be about half the supply potential $+V$. The current equalizing circuit is symbolized at 15.

The current source transistors Q9 and Q10 are matched and have their bases connected together to a bias potential of about two junction voltages above earth. In order that the collector current $I_T$ of Q10 shall be half of that of Q9, resistor R2 is approximately twice the value of R1.

In FIG. 4, it is assumed that whatever circuit is to be connected to terminal 13 will not draw any bias current but that it is desirable to draw a current $I_B$ of say, 4μA from points 13 and 14 in order to maintain proper action of the current equalizing circuit 15. 4μA current sinks attached to points 14 and 13 are formed by matched npn transistors Q11, Q12 with their bases conected together to a small fixed bias potential (approximately $2V_{be}$) and their emitters returned to ground via matched 150 kohm resistors R3 and R4.

I claim:

1. An electrically variable impedance circuit comprising first and second circuit branches having a point common thereto, a source of a variable control current feeding said first and second circuit branches in parallel, a circuit connected to said two branches and tending to equalize the currents in said two branches, each branch including at least one three-terminal semiconductor device having first, second and further terminals and connected in the branch by way of said first and second terminals, said further terminals of said devices being interconnected via junctions of the two semiconductor devices and said point common to said two branches, said junctions being connected back to back and variably forward biased by said control current to provide a controlled impedance between a first one of said further terminals corresponding to the first branch and serving as a voltage reference and the second one of said further terminals corresponding to said second branch serving as an input terminal, and the improvement comprising a first further semiconductor device connected to said first branch to pass a predetermined current establishing an offset between the current in that branch as determined by said current equalizing circuit and the current passing between said first and second terminals of said semiconductor device in said first branch.

2. A circuit according to claim 1, wherein said input terminal is connected to the input stage of a circuit drawing bias current from the input terminal, and said first further device matches said input stage so as to draw substantially the same current from said first branch.

3. A circuit according to claim 1, further comprising a second further semiconductor device connected to said input terminal to draw bias current, the two said further devices both acting to increase the current in said current equalizing circuit relative to the current through said semiconductor devices in said first and second branches.

4. A circuit according to claim 3, wherein said two further devices are arranged to draw equal currents.

5. A circuit according to claim 3, wherein said input terminal is connected to the input stage of a circuit drawing bias current from said input terminal, and said first further device draws a current equal to the combined currents drawn by said input stage and by said second further device.

* * * * *